US012811584B2

(12) United States Patent
Ryu

(10) Patent No.: US 12,811,584 B2
(45) Date of Patent: Nov. 24, 2026

(54) DEVICE AND METHOD FOR SWITCH CONTROL

(71) Applicant: Samsung Electronics Co., Ltd., Suwon-si (KR)

(72) Inventor: Jeil Ryu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/017,385

(22) Filed: Jan. 10, 2025

(65) Prior Publication Data

US 2026/0066898 A1 Mar. 5, 2026

(30) Foreign Application Priority Data

Aug. 29, 2024 (KR) ........................ 10-2024-0116791

(51) Int. Cl.
*H03K 17/687* (2006.01)

(52) U.S. Cl.
CPC ................................ *H03K 17/6874* (2013.01)

(58) Field of Classification Search
CPC .................................................. H03K 17/6874
See application file for complete search history.

(56) References Cited

U.S. PATENT DOCUMENTS 8,847,661 B2 9/2014 Choung
9,742,404 B2 8/2017 Lee et al.
10,056,835 B2 8/2018 Eggermont
10,790,817 B2 9/2020 Murphy et al.
10,938,401 B1 3/2021 Olieman et al.
2007/0146020 A1* 6/2007 Williams .............. H02M 3/158 327/110
2015/0364171 A1* 12/2015 Hollis .................. G11C 7/1093 365/193
2021/0091655 A1* 3/2021 Hegde ................ H02M 7/5387
2024/0080036 A1 3/2024 Choi
2025/0141441 A1* 5/2025 Jodka ................... H03K 17/687

FOREIGN PATENT DOCUMENTS

CN 111211782 A 5/2020
KR 10-1387266 B1 4/2014
KR 10-2290171 B1 8/2021
KR 10-2024-0027301 A 3/2024

* cited by examiner

*Primary Examiner* — Sibin Chen
(74) *Attorney, Agent, or Firm* — Morgan, Lewis & Bockius LLP

(57) ABSTRACT

A switch device includes a non-overlap circuit outputting first to fourth control signals, voltage levels of which transition at different time points, based on an enable signal, a first bootstrap circuit increasing a voltage of a first node, based on the first control signal, a first power transfer circuit receiving the voltage of the first node and outputs a first voltage, based on the second control signal, a first switch circuit, in response to the first voltage, outputting a first signal received at an input of the first switch circuit to a third node, a second bootstrap circuit, a second power transfer circuit, and a second switch circuit performing the same functions as the first bootstrap circuit, the first power transfer circuit, and the first switch circuit to output a second signal to the third node based on the third control signal and the fourth control signal.

20 Claims, 12 Drawing Sheets

1000

DEVICE AND METHOD FOR SWITCH CONTROL

CROSS-REFERENCE TO RELATED APPLICATIONS

This application claims priority under 35 U.S.C. § 119 to Korean Patent Application No. 10-2024-0116791 filed on Aug. 29, 2024, in the Korean Intellectual Property Office, the disclosure of which is incorporated by reference herein in their entireties.

BACKGROUND

Embodiments of the present disclosure described herein relate to a switch, and more particularly, relate to a device for decreasing on-resistance of a switch.

As an integrated circuit process technology and a digital signal processing technology develop, there is an increasing demand on an analog-to-digital converter (ADC) which converts an analog signal into a digital signal. A factor which acts as a main factor in the performance of the analog-to-digital converter is a signal to noise and distortion ratio (SNDR) of the analog input signal, and a main element determining the SNDR is a sampling switch.

As the size of the sampling switch becomes larger, an on-resistance value may become smaller, but the SNDR may decrease due to the increase in a parasitic capacitance. Accordingly, there is required a technology for decreasing an on-resistance even while reducing the size of a switch and increasing the degree of integration.

SUMMARY

Embodiments of the present disclosure provide a switch device decreasing an on-resistance.

According to an embodiment, a switch device includes a non-overlap circuit that outputs a first control signal to a fourth control signal, voltage levels of which transition at different time points, based on an enable signal, a first bootstrap circuit that increases a voltage of a first node, based on the first control signal, a first power transfer circuit that receives the voltage of the first node and outputs a first voltage, based on the second control signal, a first switch circuit that, in response to the first voltage, outputs a first signal received at an input of the first switch circuit to a third node, a second bootstrap circuit that increases a voltage of a second node, based on the third control signal, a second power transfer circuit that receives the voltage of the second node and outputs a second voltage, based on the fourth control signal, and a second switch circuit that in response to the second voltage, outputs a second signal received at an input of the second switch circuit to the third node.

According to an embodiment, a switch control method of a switch control device which includes a first bootstrap circuit, a second bootstrap circuit, a first power transfer circuit, a second power transfer circuit, a first switch circuit, and a second switch circuit includes setting, by the first bootstrap circuit, an initial voltage of a first node and setting, by the second bootstrap circuit, an initial voltage of a second node, blocking, by the second power transfer circuit, an output of a voltage of the second node, outputting, by the first power transfer circuit, a voltage of the first node, increasing, by the first bootstrap circuit, a voltage value of the first node, and outputting, in response to the voltage of the first node and by the first switch circuit, a first signal applied to an input of the first switch circuit.

According to an embodiment, a switch device includes a non-overlap circuit that outputs a first control signal and a second control signal, voltage levels of which transition at different time points, based on an enable signal, a bootstrap circuit that increases a voltage of a first node, based on the first control signal, a power transfer circuit that receives the voltage of the first node and to output a first voltage, based on the second control signal, and a switch circuit that, in response to the first voltage, outputs a first signal received at an input of the switch circuit.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily carries out the present disclosure.

Figure 1:
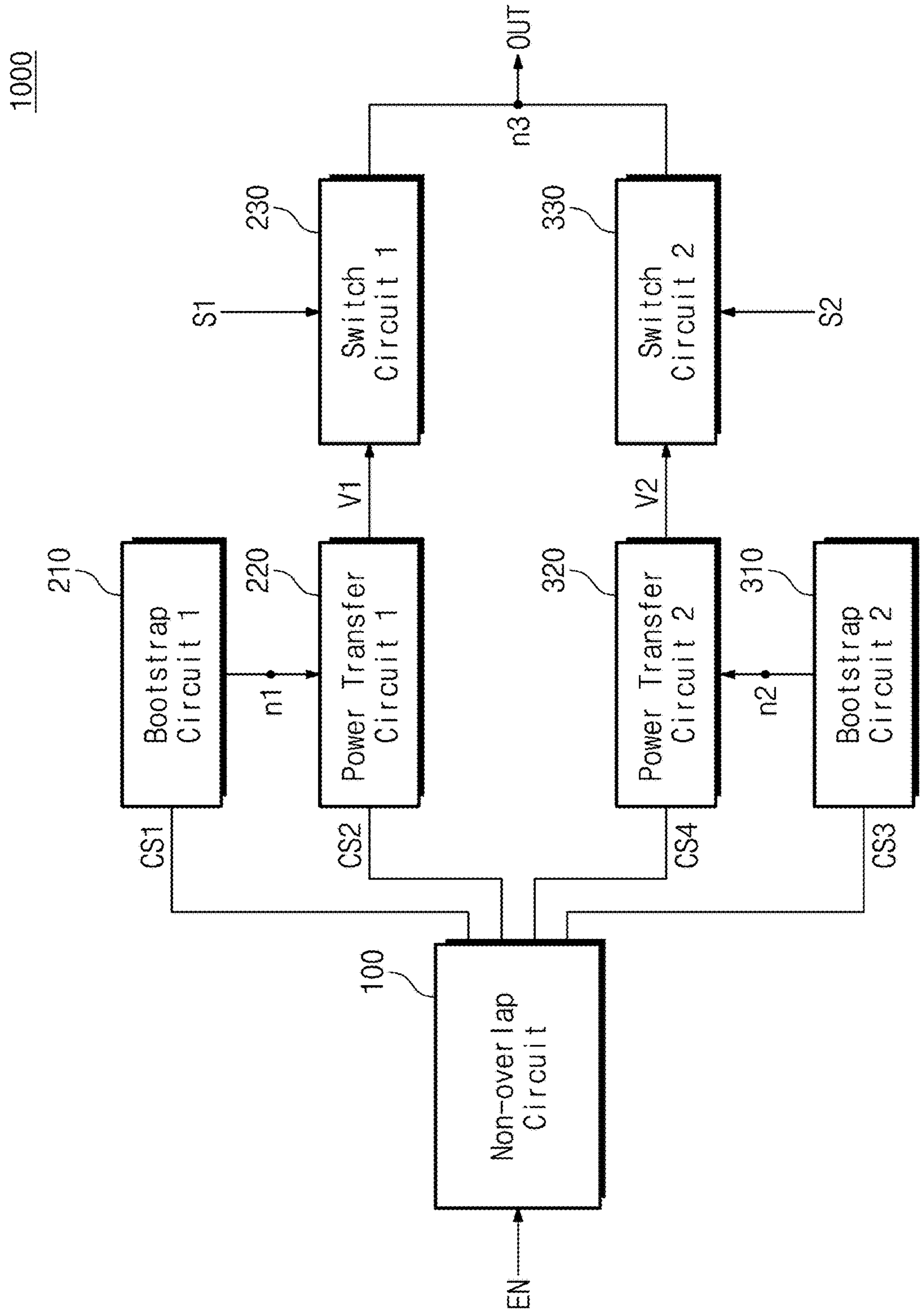
FIG. 1 is a diagram illustrating a configuration of a switch device, according to an embodiment of the present disclosure.

FIG. 1 is a diagram illustrating a configuration of a switch device 1000 according to an embodiment of the present disclosure.

The switch device 1000 may include a non-overlap circuit 100, a first bootstrap circuit 210, a first power transfer circuit 220, a first switch circuit 230, a second bootstrap circuit 310, a second power transfer circuit 320, and a second switch circuit 330.

The non-overlap circuit 100 may be configured to output a first control signal CS1, a second control signal CS2, a third control signal CS3, and a fourth control signal CS4, which have different point in times when voltage levels transition, based on an enable signal EN. For example, based on whether the voltage level of the enable signal EN is a high level or a low level, the non-overlap circuit 100 may be configured to output the first to fourth control signals CS1 to CS4 having an arbitrary voltage level. For example, when the voltage level of the enable signal EN is the high level, the non-overlap circuit 100 may be configured to output the first control signal CS1 of the high level, the second control signal CS2 of the low level, the third control signal CS3 of the low level, and the fourth control signal CS4 of the high level.

For example, when the voltage level of the enable signal EN transitions, the non-overlap circuit 100 may be configured to allow the voltage levels of the first to fourth control signals CS1 to CS4 to transition to opposite levels. Points in time when the first to fourth control signals CS1 to CS4 transition to opposite levels under control of the non-overlap circuit 100 may be different from each other. When the voltage level of the enable signal EN transitions, the non-overlap circuit 100 may be configured to allow the voltage levels of the first to fourth control signals CS1 to CS4 to transition with a delay time interval. The non-overlap circuit 100 will be described in detail with reference to FIGS. 2 to 5.

The first bootstrap circuit 210 may be configured to increase a voltage of a first node n1, based on the first control signal CS1. For example, when the first control signal CS1 is at the high level, the first bootstrap circuit 210 may be configured to increase the voltage of the first node n1. For example, the first bootstrap circuit 210 may be configured to store a voltage provided from a power device and to increase the voltage of the first node n1 through the stored voltage as the first control signal CS1 is received. For example, the first bootstrap circuit 210 may be configured to control an upper limit of a voltage value of the first node n1 such that the breakdown voltages of the first power transfer circuit 220 and the first switch circuit 230 are controlled. For example, when the voltage value of the first node n1 exceeds a threshold value, the first bootstrap circuit 210 may be configured to decrease the voltage value of the first node n1 to the threshold value. The first bootstrap circuit 210 will be described in detail with reference to FIG. 6.

The first power transfer circuit 220 may be configured to receive the voltage of the first node n1 and to output a first voltage V1, in response to the second control signal CS2. For example, the first bootstrap circuit 210 and the first power transfer circuit 220 may be connected through the first node n1. For example, when the second control signal CS2 is at the low level, the first power transfer circuit 220 may be configured to output the first voltage V1. For example, when the second control signal CS2 is at the high level, the first power transfer circuit 220 may be configured to block the first voltage V1. For example, as the voltage of the first node n1 increases, the first voltage V1 may increase. The value of the first voltage V1 may be a value obtained by subtracting a voltage corresponding to an internal resistance of the first power transfer circuit 220 from the voltage value of the first node n1. The first power transfer circuit 220 will be described in detail with reference to FIG. 6.

The first switch circuit 230 may be configured to output a first signal S1 to a third node n3 in response to the first voltage V1. For example, when the first voltage V1 is at the high level, the first switch circuit 230 may be configured to output the first signal S1. For example, when the first voltage V1 is at the low level, the first switch circuit 230 may be configured to block the first signal S1.

As the first voltage V1 increases, the on-resistance of the first switch circuit 230 may decrease. The on-resistance may mean a resistance which is between an input terminal and an output terminal of the first switch circuit 230 when the first switch circuit 230 is turned on. For example, the value of the first voltage V1 may be greater than the voltage value of the enable signal EN by the first bootstrap circuit 210. For example, the voltage of the first node n1 may be increased by the first bootstrap circuit 210. As the voltage of the first node n1 increases, the first voltage V1 may increase. As the first voltage V1 increases, the on-resistance of the first switch circuit 230 may decrease. Compared to the case where the enable signal EN is directly input to the first switch circuit 230, as the first voltage V1 is input to the first switch circuit 230, the on-resistance of the first switch circuit 230 may decrease.

The second bootstrap circuit 310 may be configured to increase a voltage of a second node n2, based on the third control signal CS3. The second bootstrap circuit 310 may be configured to perform the same function as the first bootstrap circuit 210 except that the second bootstrap circuit 310 operates in response to the third control signal CS3.

The second power transfer circuit 320 may be configured to receive the voltage of the second node n2 and to output a second voltage V2, in response to the fourth control signal CS4. The second power transfer circuit 320 may be configured to perform the same function as the first power transfer circuit 220 except that the second power transfer circuit 320 operates in response to the fourth control signal CS4.

The second switch circuit 330 may be configured to output a second signal S2 to the third node n3 in response to the second voltage V2. The second switch circuit 330 may be configured to perform the same function as the first switch circuit 230 except that the second switch circuit 330 selectively outputs the second signal S2 in response to the second voltage V2.

Figure 2:
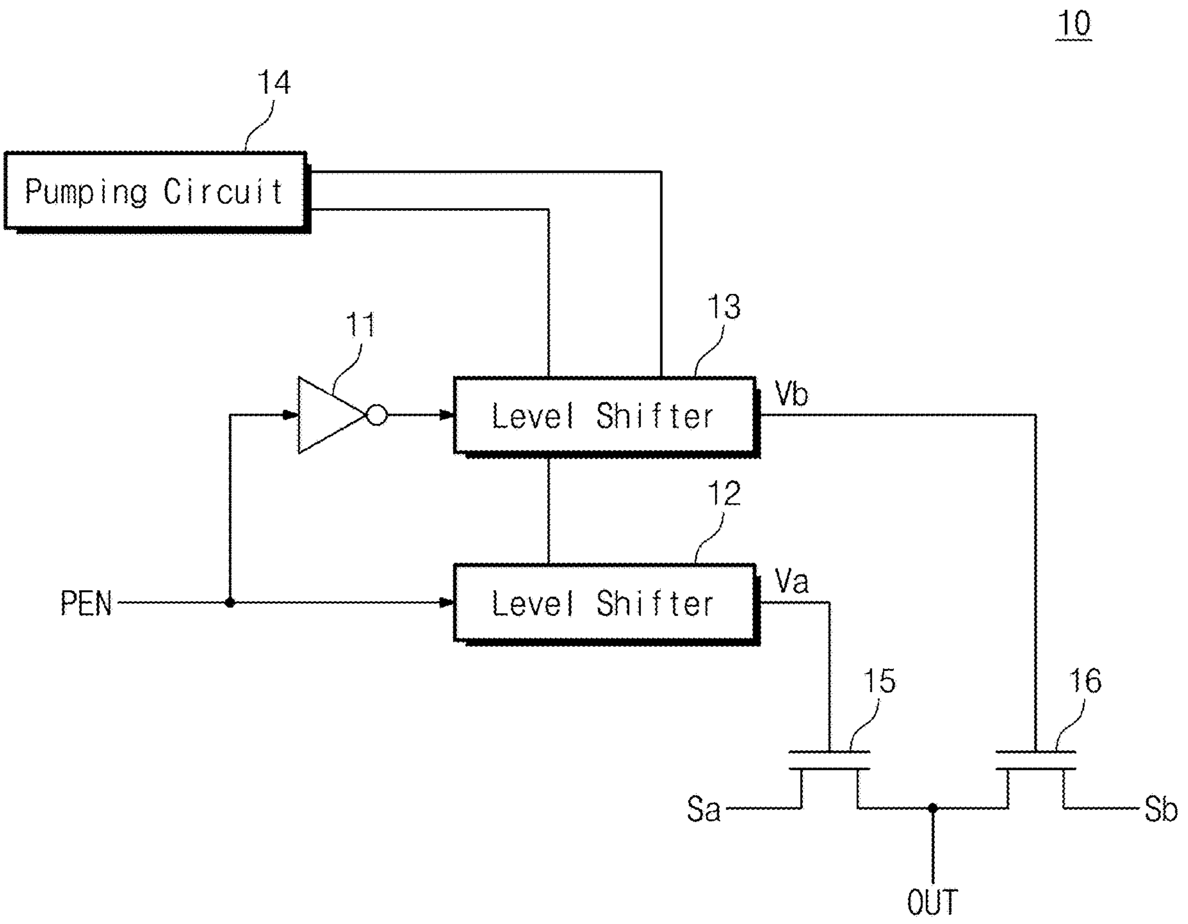
FIG. 2 is a diagram illustrating a level shifter switch device.
Figure 3:
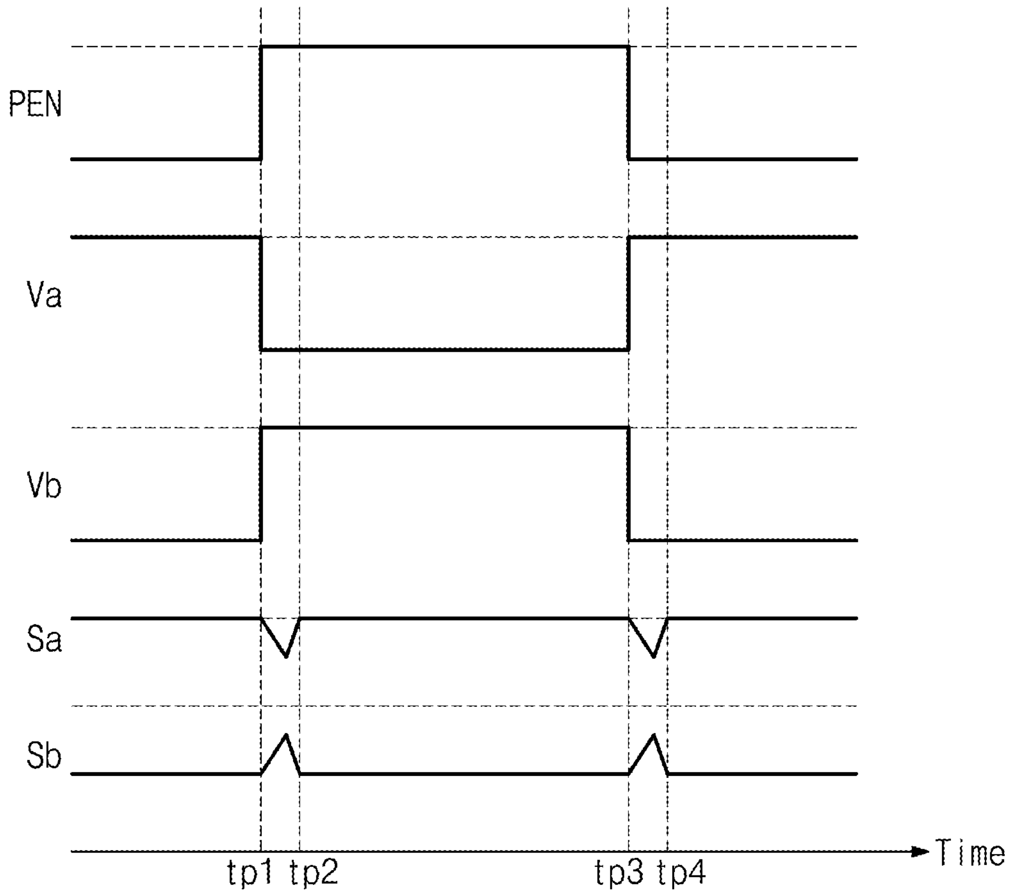
FIG. 3 is a diagram illustrating waveforms of internal voltages of a level shifter switch device.

FIG. 2 is a diagram illustrating a level shifter switch device 10. FIG. 3 is a diagram illustrating waveforms of internal voltages of the level shifter switch device 10. Below, the description will be given with reference to FIGS. 2 and 3 together.

Referring to FIG. 2, the level shifter switch device 10 may include an inverter 11, a level shifter 12, a level shifter 13, a pumping circuit 14, a switch 15, and a switch 16.

An enable signal PEN may be input to the level shifter 12 and may be input to the level shifter 13 through the inverter 11. The level shifters 12 and 13 may be configured to shift the level of the enable signal PEN and to output voltages Va and Vb at which the switches 15 and 16 are capable of operating. The pumping circuit 14 may be configured to decrease the on-resistances of the switches 15 and 16. For example, the pumping circuit 14 may be configured to increase the voltages Va and Vb such that the on-resistances of the switches 15 and 16 decrease. For example, the level shifters 12 and 13 and the pumping circuit 14 may be configured to output the voltages Va and Vb, based on the enable signal PEN. The switches 15 and 16 may be configured to selectively output signals Sa and Sb in response to the voltages Va and Vb.

As the pumping circuit 14 is used, a time may be required to increase the voltages Va and Vb. For example, the pumping circuit 14 may include a power device, and a dummy timing for the power device may be required. For example, the dummy timing may include a time necessary to input a voltage through the power device, a time necessary to switch the power device, etc. As the pumping circuit 14 is included in the level shifter switch device 10, operating times of the switches 15 and 16 may be delayed.

Referring to FIG. 3, as the enable signal PEN transitions, a switching current may occur at the signals Sa and Sb.

For example, at a point in time tp1, when the enable signal PEN transitions from the low level to the high level, the voltage Va may transition from the high level to the low level, and the voltage Vb may transition from the low level to the high level. As the voltage levels of the voltages Va and Vb simultaneously transition, a point in time when the signals Sa and Sb are simultaneously applied may exist.

As the voltage Va of the high level and the voltage Vb of the high level are input to the switches 15 and 16, all the switches 15 and 16 may be turned on. For example, voltage values of the signals Sa and Sb may be different from each other. For example, the voltage value of the signal Sa may be greater than the voltage value of the signal Sb. As the signals Sa and Sb whose voltage values are different are connected, the switching current by which a voltage of the signal Sa decreases and a voltage of the signal Sb increases may occur. For example, the switching current may be in the shape of the signals Sa and Sb illustrated in a time interval from tp1 to tp2. For example, the switching current may be generated even when the enable signal PEN transitions from the high level to the low level. At a point in time tp3, as the enable signal PEN transitions, the switching current may be generated. For example, the switching current may be in the shape of the signals Sa and Sb illustrated in a time interval from tp3 to tp4. As the switching current is generated, various issues such as power loss, an increase in electrical stress of the switches 15 and 16, a switching noise, and signal distortion may occur in the level shifter switch device 10.

Figure 4:
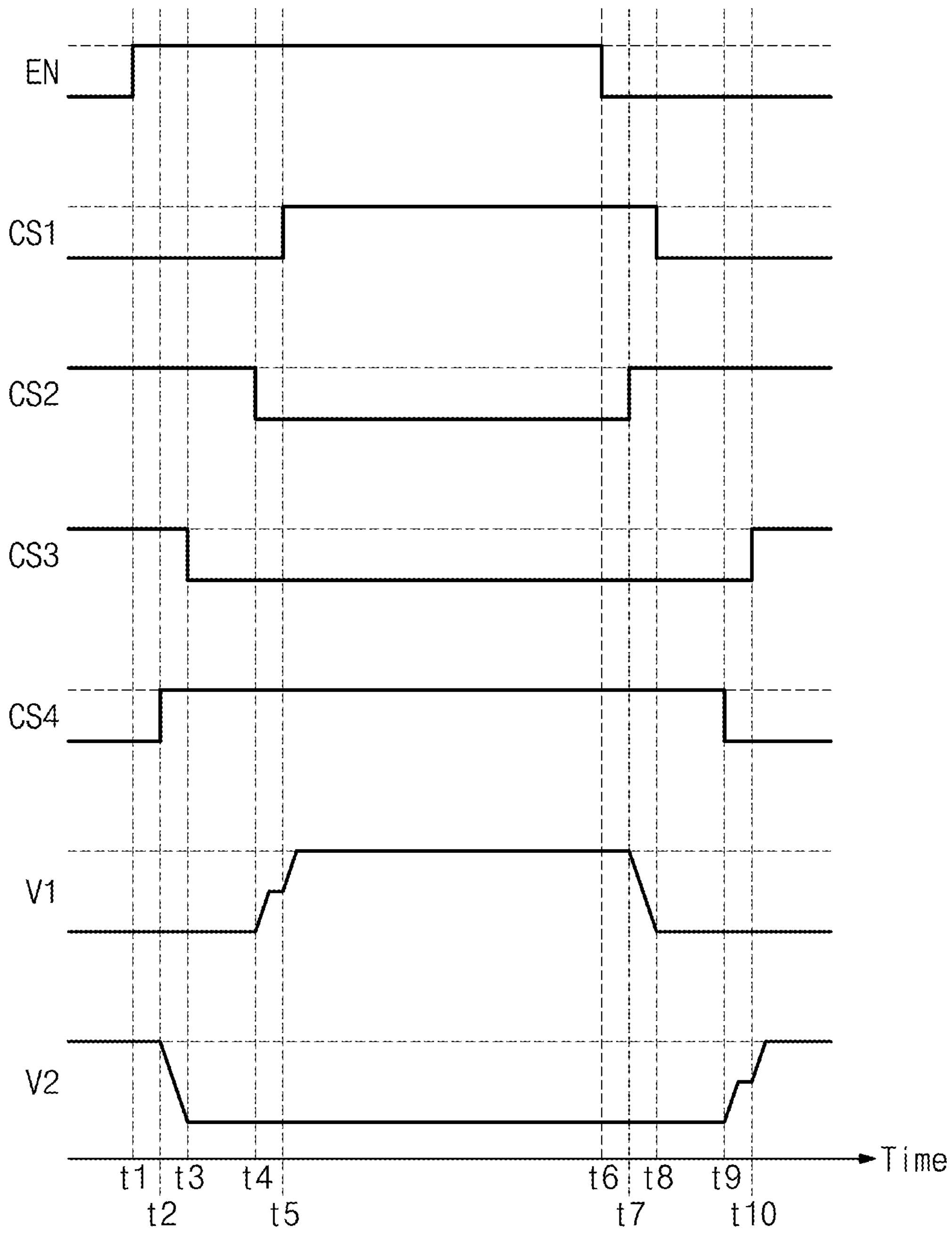
FIG. 4 is a diagram illustrating waveforms of internal voltages of a switch device when a non-overlap circuit outputs a first control signal to a fourth control signal which have different transition time points, according to an embodiment of the present disclosure.

FIG. 4 is a diagram illustrating waveforms of internal voltages of the switch device 1000 when the non-overlap circuit 100 outputs the first control signal CS1 to the fourth control signal CS4 which have different transition time points, according to an embodiment of the present disclosure. Below, the description will be given with reference to FIG. 1 together.

As the non-overlap circuit 100 outputs the first control signal CS1 to the fourth control signal CS4 which have different transition time points, the switching current may be prevented. For example, the enable signal EN may transition, and points in time when the first control signal CS1 to the fourth control signal CS4 transition may be different. For example, the enable signal EN may transition at the point in time t1, the fourth control signal CS4 may transition at the point in time t2, the third control signal CS3 may transition at the point in time t3, the second control signal CS2 may transition at the point in time t4, and the first control signal CS1 may transition at the point in time t5. From the point in time t3 to the point in time t4, as a low-level voltage is input as the first voltage V1 and the low-level voltage is input as the second voltage V2, both the first switch circuit 230 and the second switch circuit 330 may be turned off.

From the point in time t5 to the point in time t6, the first switch circuit 230 may be turned on. To prevent the first switch circuit 230 and the second switch circuit 330 from being simultaneously turned on, the non-overlap circuit 100 may be configured such that the first switch circuit 230 is turned off and the second switch circuit 330 is then turned on. For example, the enable signal EN may transition at the point in time t6, the second control signal CS2 may transition at the point in time t7, and the first control signal CS1 may transition at the point in time t8. From the point in time t7 to the point in time t8, the first switch circuit 230 may be turned off. At the point in time t9, the fourth control signal CS4 may transition, and the second switch circuit 330 may be turned on. At the point in time t10, the third control signal CS3 may transition. How the non-overlap circuit 100 controls the first control signal CS1 to the fourth control signal CS4 will be described in detail with reference to FIG. 8.

Figure 5:
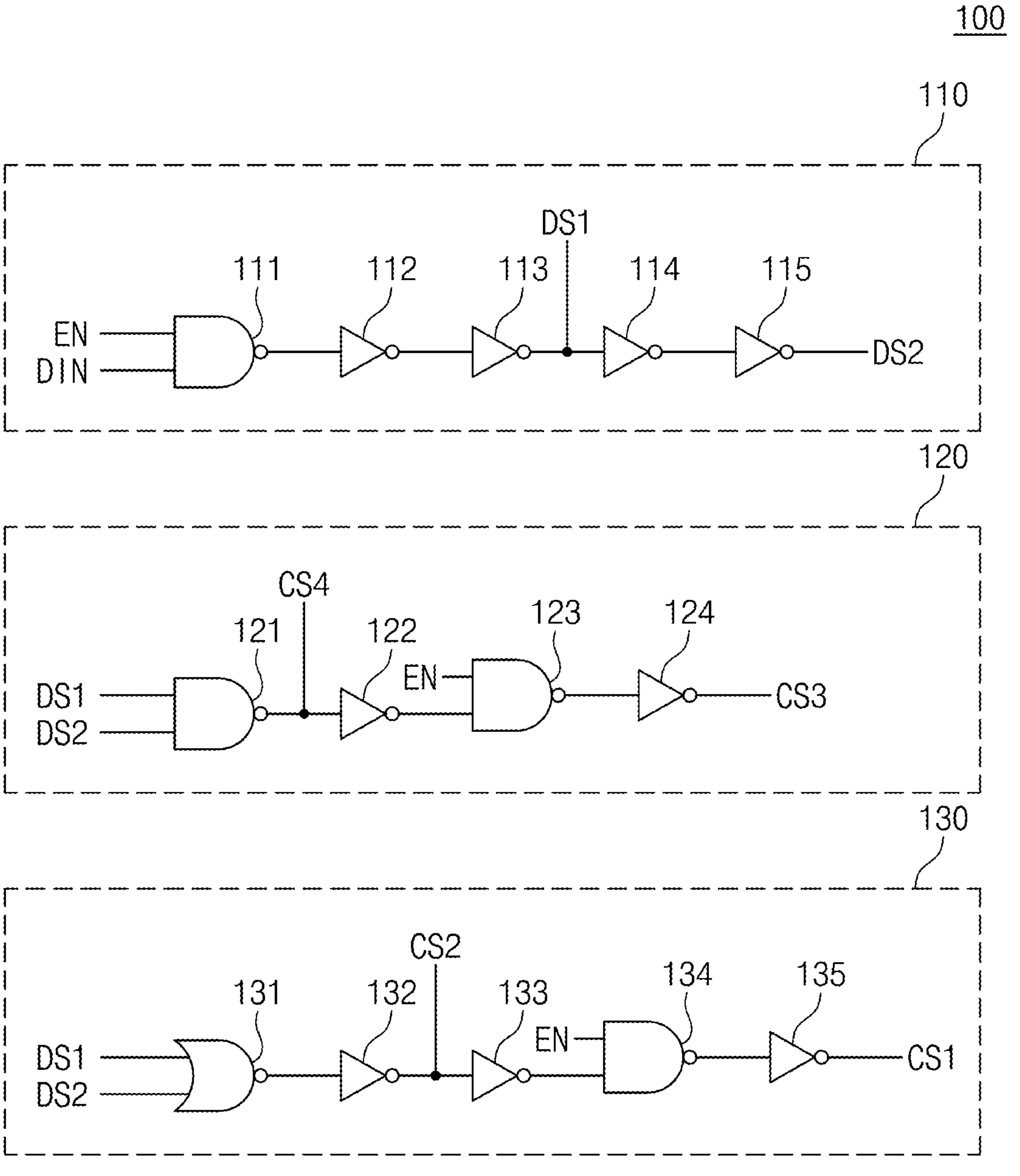
FIG. 5 is a diagram illustrating a configuration of a non-overlap circuit, according to an embodiment of the present disclosure.

FIG. 5 is a diagram illustrating a configuration of the non-overlap circuit 100, according to an embodiment of the present disclosure. Below, the description will be given with reference to FIG. 1 together.

The non-overlap circuit 100 may include a plurality of gates 111, 121, 123, 131, and 134 and a plurality of inverters 112 to 115, 122, 124, 132, 133, and 135 and may be configured to output the first to fourth control signals CS1 to CS4 whose transition time points are different from each other. A first delay line 110 may include the NAND gate 111 and the plurality of inverters 112 to 115. A second delay line 120 may include the plurality NAND gates 121 and 123 and the plurality of inverters 122 and 124. A third delay line 130 may include the NOR gate 131, the NAND gate 134, and the plurality of inverters 132, 133, and 135.

The enable signal EN may be propagated to the first delay line 110 through the NAND gate 111, may be propagated to the second delay line 120 through the NAND gate 123, and may be propagated to the third delay line 130 through the NAND gate 134. A digital input signal DIN may be propagated to the first delay line 110 through the NAND gate 111. For example, the digital input signal DIN may always have the high-level signal.

The first control signal CS1 may be provided from an output of the inverter 135. The second control signal CS2 may be provided from an output of the inverter 132. The third control signal CS3 may be provided from an output of the inverter 124. The fourth control signal CS4 may be provided from an output of the NAND gate 121.

For example, the first delay line 110 may be configured to output digital signals DS1 and DS2 whose transition time points are different from each other. The first digital signal DS1 may be provided from an output of the inverter 113. The second digital signal DS2 may be provided from an output of the inverter 115.

For example, the second delay line 120 may be configured such that the transition of the voltage level of the fourth control signal CS4 precedes the transition of the voltage level of the third control signal CS3. For example, the third delay line 130 may be configured such that the transition of the voltage level of the second control signal CS2 precedes the transition of the voltage level of the first control signal CS1. For example, the waveforms of the non-overlap circuit 100 of FIG. 5 may be the same as those illustrated in FIG. 4. Referring to FIG. 4, to prevent the first switch circuit 230 and the second switch circuit 330 from being simultaneously turned on, the non-overlap circuit 100 may be configured such that the second switch circuit 330 is turned on after the first switch circuit 230 is turned off. When all the digital signals DS1 and DS2 are at the low level, the NOR gate 131 may be configured to output the high-level voltage; excepting the above case, the NOR gate 131 may be configured to output the low-level voltage. As the transition time point of the voltage level of the second digital signal DS2 is later than that of the first digital signal DS1, the order in which the voltage levels of the first to fourth control signals CS1 to CS4 transition to turn on the first switch circuit 230 may be different from the order in which the voltage levels of the first to fourth control signals CS1 to CS4 transition to turn on the second switch circuit 330. For example, when the first switch circuit 230 is turned on, the transition of voltage levels may be made in order of the fourth control signal CS4, the third control signal CS3, the second control signal CS2, and the first control signal CS1. When the second switch circuit 330 is turned on, the transition of voltage levels may be made in order of the second control signal CS2, the first control signal CS1, the fourth control signal CS4, and the third control signal CS3.

FIG. 5 only shows an embodiment in which the non-overlap circuit 100 provides the first to fourth control signals CS1 to CS4 whose voltage level transition time points are different from each other, and the non-overlap circuit 100 may be configured to be different from the example illustrated in FIG. 5.

Figure 6:
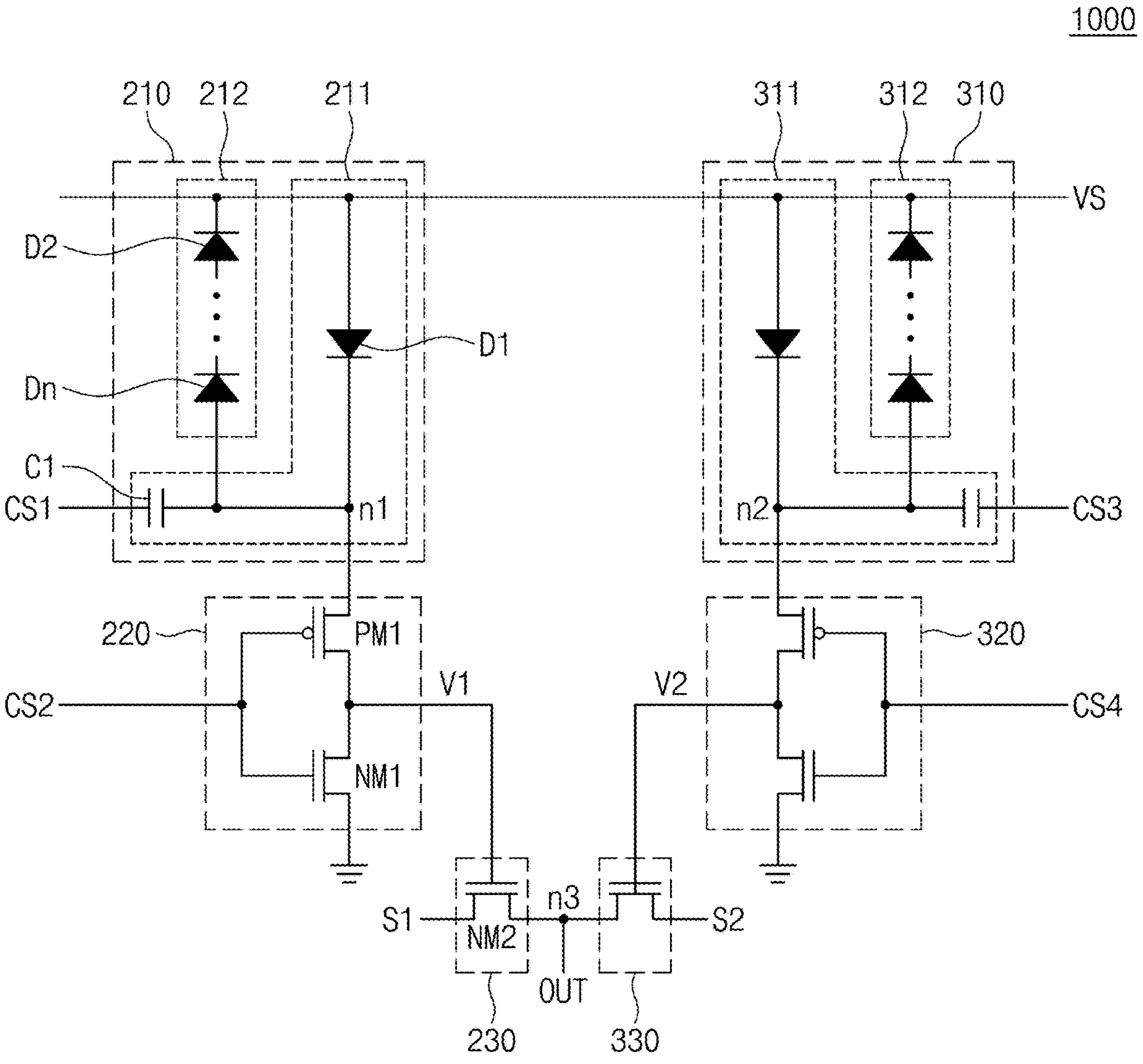
FIG. 6 is a diagram illustrating a switch device, according to an embodiment of the present disclosure.

FIG. 6 is a diagram illustrating the switch device 1000, according to an embodiment of the present disclosure. Below, for brevity of description, additional description associated with the components described with reference to FIG. 1 will be omitted to avoid redundancy.

Referring to FIG. 6, the first bootstrap circuit 210 may include a first precharge circuit 211 and a first breakdown voltage control circuit 212.

The first precharge circuit 211 may be configured to increase the voltage of the first node n1 in response to the first control signal CS1. For example, before the first control signal CS1 is input, the first precharge circuit 211 may store a voltage provided from a power device VS. However, even after the first control signal CS1 is input, the first precharge circuit 211 may receive the voltage from the power device VS. The first precharge circuit 211 may be configured to increase the voltage of the first node n1 through the stored voltage as the first control signal CS1 is input. For example, unlike the pumping circuit 14 of FIG. 2, because the first precharge circuit 211 is storing the voltage from the power device VS, the dummy timing for inputting the power device VS may be removed. For example, the first precharge circuit 211 may be configured to increase the voltage of the first node n1 without the dummy timing.

According to an embodiment, the first precharge circuit 211 may include a first diode D1 and a first capacitor C1. The first diode D1 may be connected between the power device VS and the first node n1. The first diode D1 may be connected such that an electrical signal flows in one way, that is, from the power device VS to the first node n1. The first capacitor C1 may be connected between a node to which the first control signal CS1 is input and the first node n1.

The first diode D1 may be provided with the voltage from the power device VS and may input a voltage to the first node n1. For example, a voltage value which the power device VS outputs may be "Vdd [V]", and a forward voltage drop of the first diode D1 may be "Vth [V]". Before the first control signal CS1 is input, the voltage value of the first node n1 may be "Vdd−Vth [V]".

The first capacitor C1 may charge the voltage input to the first node n1. For example, a voltage of "Vdd−Vth [V]" may be charged in the first capacitor C1. When the first control signal CS1 is input, the first capacitor C1 may increase the voltage of the first node n1 as much as the voltage value of the first control signal CS1. For example, the voltage value of the first control signal CS1 may be "Vdd [V]". When the first control signal CS1 is input, the voltage value of the first node n1 may be "2Vdd−Vth [V]".

The first breakdown voltage control circuit 212 may be configured to control the upper limit of the voltage value of the first node n1. For example, when the voltage value of the first node n1 exceeds the threshold value, the first breakdown voltage control circuit 212 may be configured to decrease the voltage value of the first node n1 to the threshold value. For example, transistors may be included in the first power transfer circuit 220 and the first switch circuit 230. The first breakdown voltage control circuit 212 may control the upper limit of the voltage value of the first node n1 such that the breakdown of the internal transistors is prevented.

According to an embodiment, the first breakdown voltage control circuit 212 may include a plurality of diodes D2 to Dn. For example, the plurality of diodes D2 to Dn may be connected in series such that an electrical signal flows in one way, that is, from the first node n1 to the power device VS. For example, as the number of diodes D2 to Dn increases, the threshold value of the voltage value of the first node n1 may increase. For example, the number of diodes D2 to Dn may be "n". A forward voltage drop of each of the plurality of diodes D2 to Dn may be "Vth [V]", and thus, a forward voltage drop of the plurality of diodes D2 to Dn may be "n*Vth [V]". The voltage value which the power device VS outputs may be "Vdd [V]". The threshold value of the voltage value of the first node n1 may be "Vdd+n*Vth [V]". For example, when the voltage value of the first node n1 is greater than "Vdd+n*Vth [V]", an electrical signal may flow from the first node n1 to the power device VS, and thus, the voltage value of the first node n1 may decrease. The change in the voltage value of the first node n1 will be described in detail with reference to FIGS. 7A and 7B.

The first power transfer circuit 220 may include a CMOS inverter. Accordingly, the CMOS inverter may include a first PMOS transistor PM1 and a first NMOS transistor NM1. For example, a first end of the first PMOS transistor PM1 may be connected to the first node n1. For example, a first end of the first NMOS transistor NM1 may be connected to a second end of the first PMOS transistor PM1, and a second end of the first NMOS transistor NM1 may be connected to a ground electrode.

In detail, the source terminal of the first PMOS transistor PM1 may be connected to the first node n1. The drain terminal of the first NMOS transistor NM1 may be connected to the drain terminal of the first PMOS transistor PM1 and the first switch circuit 230. The first power transfer circuit 220 may output the first voltage V1 through the drain terminal of the first NMOS transistor NM1. The source terminal of the first NMOS transistor NM1 may be connected to the ground electrode. Gate electrodes of the first NMOS transistor NM1 and the first PMOS transistor PM1 may be connected to a node to which the second control signal CS2 is input.

For example, when the second control signal CS2 at the low level, the first power transfer circuit 220 may receive the voltage of the first node n1 and may output the first voltage V1. For example, in the first power transfer circuit 220, the voltage of the first node n1 may be dropped as much as a voltage value corresponding to a channel resistance of the first PMOS transistor PM1, so as to be output as the first voltage V1. When the second control signal CS2 at the high level, the first power transfer circuit 220 may prevent the voltage of the first node n1 from being output as the first voltage V1.

The first switch circuit 230 may include a second NMOS transistor NM2. For example, the first voltage V1 may be input to a gate terminal of the second NMOS transistor NM2. A first end of the second NMOS transistor NM2 may be connected to a node to which the first signal S1 is input, and a second end of the second NMOS transistor NM2 may be connected to the third node n3. When the first voltage V1 is the high-level voltage, the second NMOS transistor NM2 may output the first signal S1 to the third node n3.

The second bootstrap circuit 310, the second power transfer circuit 320, and the second switch circuit 330 may be implemented with elements which perform the same functions as the first bootstrap circuit 210, the first power transfer circuit 220, and the first switch circuit 230, and thus, additional description associated with the second bootstrap circuit 310, the second power transfer circuit 320, and the second switch circuit 330 will be omitted for brevity of description.

Figure 7A:
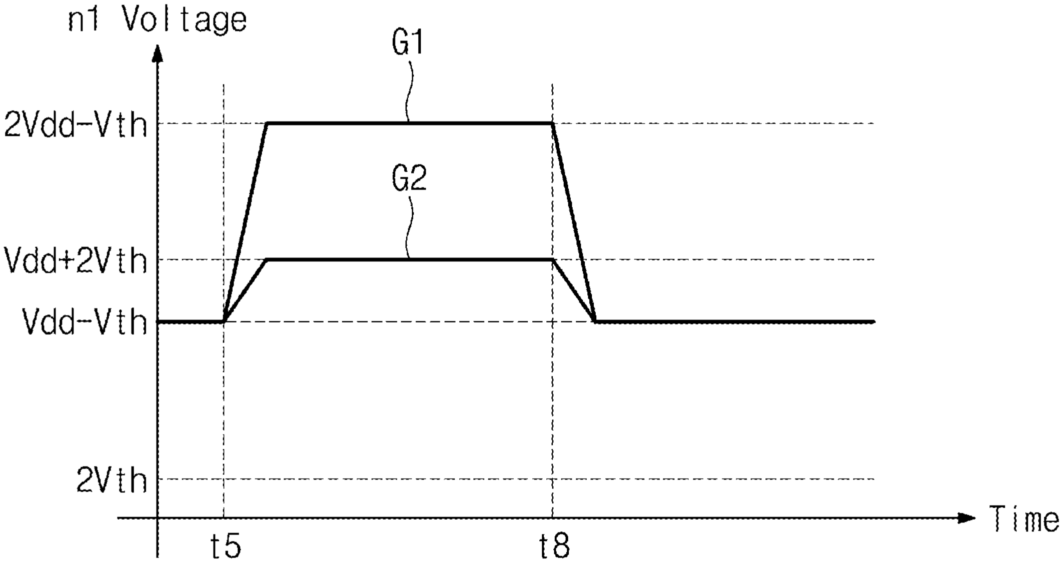
FIG. 7A is a diagram illustrating a voltage change of a first node according to an operation of a switch device of FIG. 6.
Figure 7B:
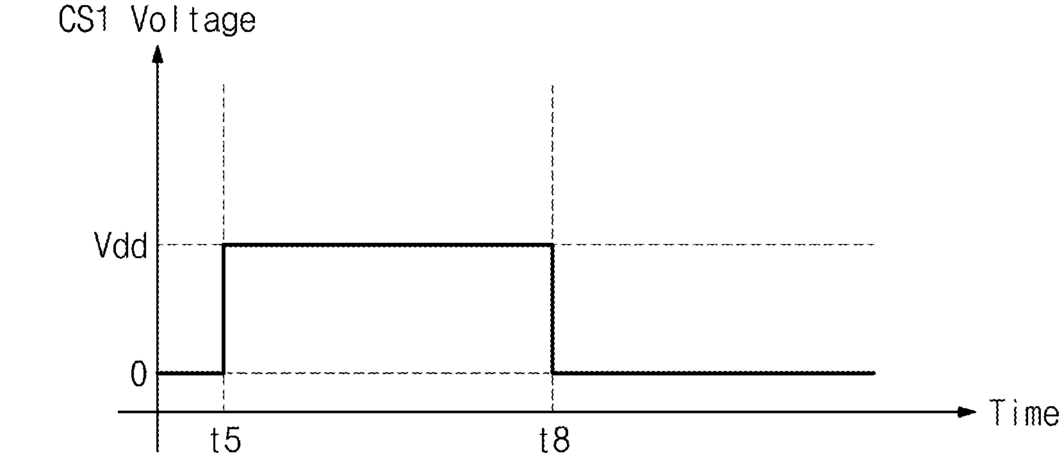
FIG. 7B is a diagram for describing a voltage change of a first node according to a change in a first control signal.

FIG. 7A is a diagram illustrating a voltage change of the first node n1 according to an operation of the switch device 1000 of FIG. 6. FIG. 7B is a diagram for describing a voltage change of the first node n1 according to a change in the first control signal CS1. Below, the description will be given with reference to an example in which the number of diodes D2 to Dn is "2". Below, the description will be given with reference to FIGS. 6, 7A, and 7B together.

Referring to FIGS. 7A and 7B, a voltage graph of the first node n1 does not necessarily appear as shown, and a voltage may not increase or decrease linearly.

Referring to FIG. 6, the forward voltage drop of each of the plurality of diodes D2 to Dn may be "Vth [V]", and thus, the forward voltage drop of the plurality of diodes D2 to Dn may be "2Vth [V]". The voltage value which the power device VS outputs may be "Vdd [V]". The voltage value of the first control signal CS1 may be "Vdd [V]". The threshold value of the voltage value of the first node n1 may be "Vdd+2Vth [V]".

Referring to FIGS. 7A and 7B again, a first graph G1 is a graph showing the case where the first breakdown voltage control circuit 212 is not provided, and a second graph G2 is a graph showing the case where the first breakdown voltage control circuit 212 is provided.

In a time interval from 0 to t5, the voltage value of the first node n1 may be "Vdd−Vth [V]". A voltage of "Vdd−Vth [V]" may be charged in the first capacitor C1. This may be made before the first control signal CS1 may be input.

At the point in time t5, the first control signal CS1 of the high level may be input to the first bootstrap circuit 210.

At the first graph G1, the voltage of the first node n1 may be increased to "2Vdd−Vth [V]" by the voltage charged in the first capacitor C1 from the point in time t5. "Vdd−Vth [V]" being a difference between the voltage of the first node n1 and the voltage value of the first control signal CS1 may be charged in the first capacitor C1.

Unlike the above description, at the second graph G2, when "2Vdd-Vth [V]" is greater than "Vdd+2Vth [V]" at the point in time t5, the upper limit of the voltage of the first node n1 may be controlled by the first breakdown voltage control circuit 212. For example, the voltage of the first node n1 may be "Vdd+2Vth [V]". For example, the voltage of the first node n1 may be "Vdd−Vth [V]" or "Vdd+2Vth [V]" at most of points in time. "2Vth [V]" being a difference between the voltage of the first node n1 and the voltage value of the first control signal CS1 may be charged in the first capacitor C1.

At the point in time t8, the first control signal CS1 of the low level may be input to the first bootstrap circuit 210.

At the first graph G1, the voltage of the first node n1 may decrease to "Vdd−Vth [V]" from the point in time t8.

At the second graph G2, the voltage of the first node n1 may decrease to "Vdd−Vth [V]" from the point in time t8. When the first precharge circuit 211 is not provided, the voltage of the first node n1 may be decreased to "2Vth [V]" by the voltage charged in the first capacitor C1. Because the first precharge circuit 211 is continuously provided with the voltage from the power device VS, the voltage of the first node n1 may decrease to "Vdd−Vth [V]".

Figure 8:
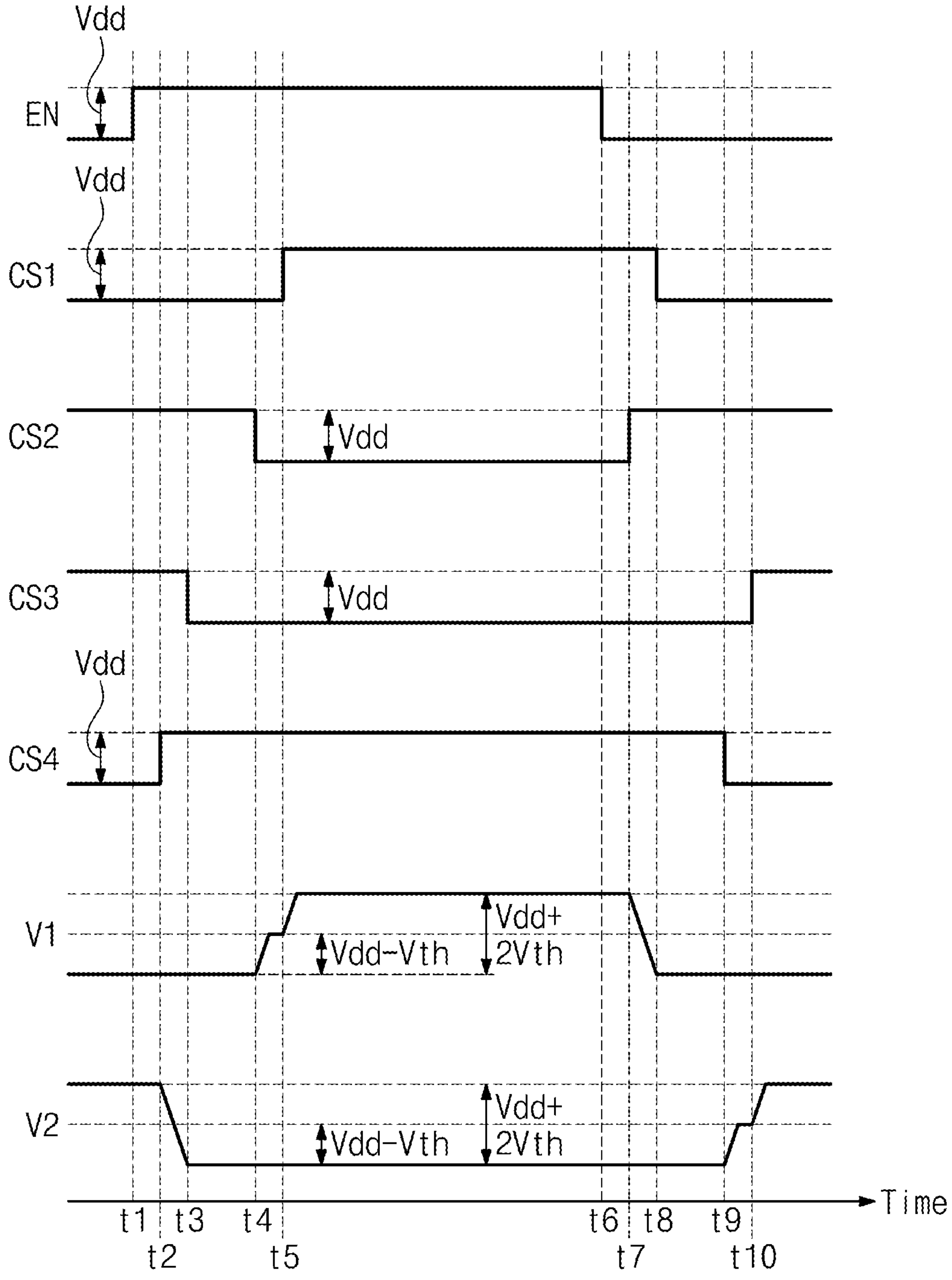
FIG. 8 is a diagram illustrating a first voltage and a second voltage according to an operation of a switch device of FIG. 6.

FIG. 8 is a diagram illustrating the first voltage V1 and the second voltage V2 according to an operation of the switch device 1000 of FIG. 6. Below, the description will be given with reference to FIGS. 1, 6, 7A, and 7B together.

Referring to FIG. 8, after the enable signal EN transitions, points in time when the first control signal CS1 to the fourth control signal CS4 transition may be differently set by the non-overlap circuit 100. For example, the enable signal EN may transition at the point in time t1, the fourth control signal CS4 may transition at the point in time t2, the third control signal CS3 may transition at the point in time t3, the second control signal CS2 may transition at the point in time t4, and the first control signal CS1 may transition at the point in time t5. For example, under control of the non-overlap circuit 100, the first control signal CS1 may be input after the second control signal CS2 is input; in this case, the first node n1 may maintain a floating node state.

At the point in time t4, as the second control signal CS2 transitions, the first voltage V1 may be increased to "Vdd−Vth [V]" by the voltage of the first node n1. At the point in time t5, as the first control signal CS1 transitions, the first bootstrap circuit 210 may increase the first voltage V1. As described with reference to FIGS. 7A and 7B, the first bootstrap circuit 210 may increase the first voltage V1 to "Vdd+2Vth [V]".

At the point in time t9, as the fourth control signal CS4 transitions, the second voltage V2 may be increased to "Vdd−Vth [V]" by the voltage of the second node n2. At the point in time t10, as the third control signal CS3 transitions, the second bootstrap circuit 310 may increase the second voltage V2. As described with reference to FIGS. 7A and 7B, the second bootstrap circuit 310 may increase the second voltage V2 to "Vdd+2Vth [V]".

The non-overlap circuit 100 may be configured such that the first switch circuit 230 and the second switch circuit 330 are not turned on. For example, the non-overlap circuit 100 may allow the voltage levels of the first control signal CS1 and the fourth control signal CS4 to transition identically. The non-overlap circuit 100 may allow the voltage levels of the second control signal CS2 and the third control signal CS3 to transition identically. The non-overlap circuit 100 may allow the voltage levels of the first control signal CS1 and the second control signal CS2 to transition to be different from each other.

Referring to FIG. 8, a potential difference of the voltage level of each of the enable signal EN and the first control signal CS1 to the fourth control signal CS4 may be "Vdd [V]". As described with reference to FIGS. 7A and 7B, the voltage of the first node n1 may be maintained at "Vdd+2Vth [V]" during most of the time during which the voltage of the first node n1 is input. For convenience of description, assuming that there is no channel resistance of the first PMOS transistor PM1, the potential difference of the voltage level of each of the first voltage V1 and the second voltage V2 may be "Vdd+2Vth [V]". As the voltage values of the first voltage V1 and the second voltage V2 which are input to the first switch circuit 230 and the second switch circuit 330 are increased to be greater than the voltage value of the enable signal EN by the switch device 1000, the on-resistances of the first switch circuit 230 and the second switch circuit 330 may decrease.

Figure 9:
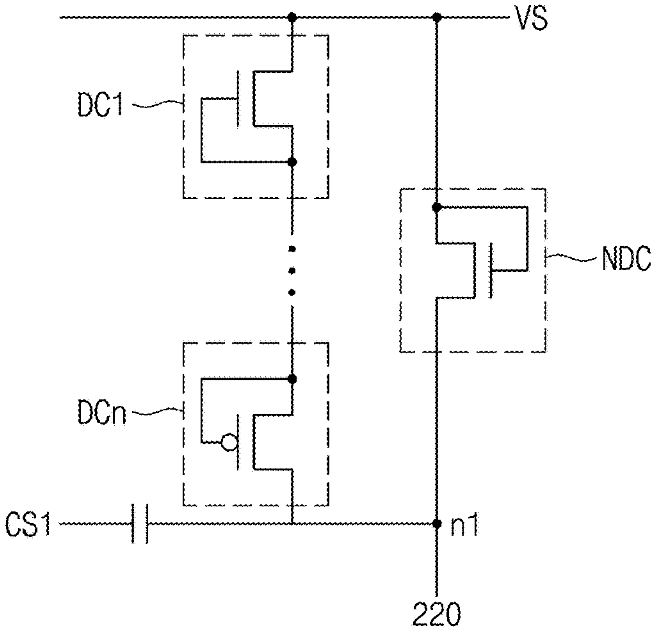
FIGS. 9 and 10 are diagrams illustrating embodiments of a first bootstrap circuit of FIG. 6.
Figure 10:
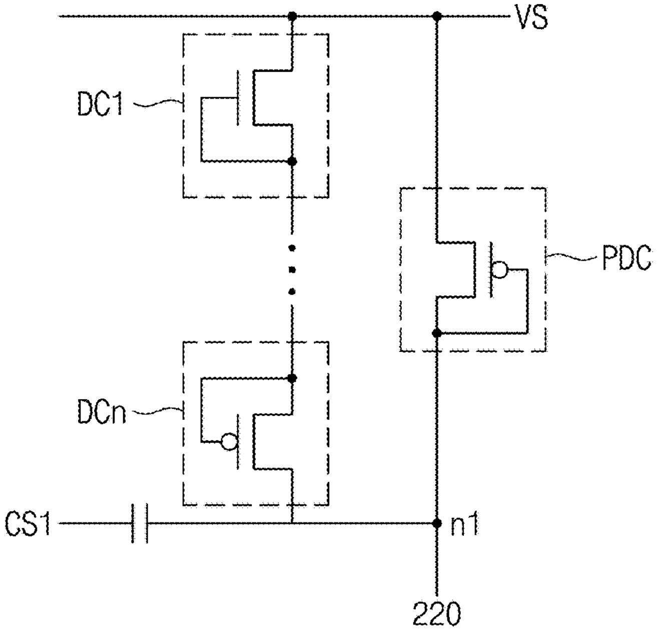

FIGS. 9 and 10 are diagrams illustrating embodiments of the first bootstrap circuit 210 of FIG. 6. Below, the description will be given with reference to FIGS. 6, 9, and 10 together.

Referring to FIG. 9, the first precharge circuit 211 may include a diode-connected transistor NDC. The first breakdown voltage control circuit 212 may include a plurality of diode-connected transistors DC1 to DCn. For example, the diode-connected transistor may include an NMOS transistor NDC. A gate terminal of the NMOS transistor NDC may be connected to a drain terminal of the NMOS transistor NDC. For example, the plurality of diode-connected transistors DC1 to DCn may include an NMOS transistor DC1 or a PMOS transistor DCn. A gate terminal of the NMOS transistor DC1 may be connected to a source terminal of the NMOS transistor DC1. A gate terminal of the PMOS transistor DCn may be connected to a drain terminal of the PMOS transistor DCn.

Referring to FIG. 10, the first precharge circuit 211 may include a diode-connected transistor PDC. The first breakdown voltage control circuit 212 may include the plurality of diode-connected transistors DC1 to DCn. For example, the diode-connected transistor may include a PMOS transistor PDC. A gate terminal of the PMOS transistor PDC may be connected to a drain terminal of the PMOS transistor PDC. For example, the plurality of diode-connected transistors DC1 to DCn may include the NMOS transistor DC1 or the PMOS transistor DCn. The gate terminal of the NMOS transistor DC1 may be connected to the source terminal of the NMOS transistor DC1. The gate terminal of the PMOS transistor DCn may be connected to the drain terminal of the PMOS transistor DCn.

Figure 11:
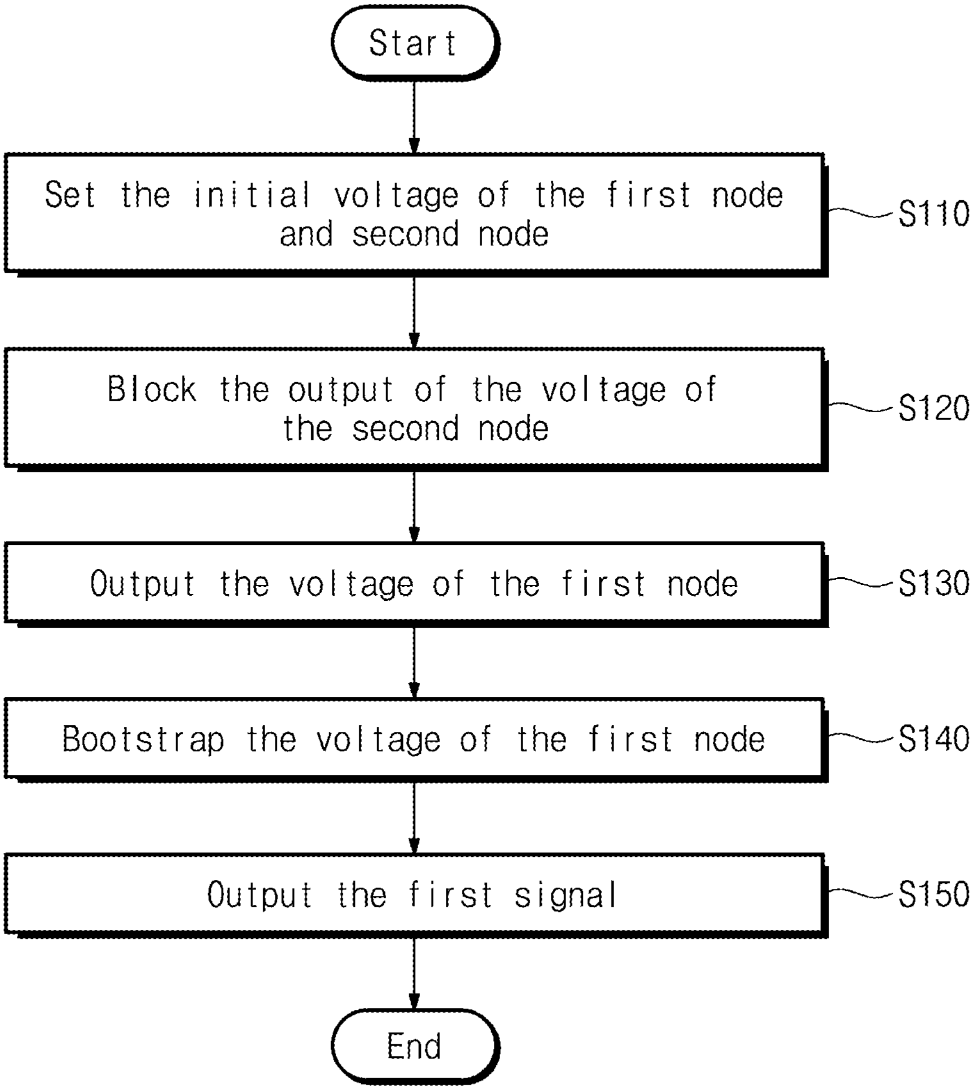
FIG. 11 is a flowchart illustrating a process in which a switch device turns on a first switch circuit.

FIG. 11 is a flowchart illustrating a process in which the switch device 1000 turns on the first switch circuit 230. Below, the description will be given with reference to FIGS. 1 and 6 together. For brevity of description, additional description associated with the components described above will be omitted to avoid redundancy.

In operation S110, the switch device 1000 may set initial voltages of the first node n1 and the second node n2. For example, the first precharge circuit 211 may set the initial voltage of the first node n1, and the second precharge circuit 311 may set the initial voltage of the second node n2.

For example, the first precharge circuit 211 may be provided with the voltage from the power device VS and may increase the voltage of the first node n1, and the first capacitor C1 may charge the first node n1 with an input voltage. The second precharge circuit 311 may perform the same operation as the first precharge circuit 211.

In operation S120, the switch device 1000 may block the voltage of the second node n2 from being output. For example, the second power transfer circuit 320 may block the voltage of the second node n2 from being output.

For example, the non-overlap circuit 100 may input the fourth control signal CS4 transitioning to the high level to the second power transfer circuit 320. The second power transfer circuit 320 may block the voltage of the second node n2 from being output to the second switch circuit 330 in response to the fourth control signal CS4.

For example, the non-overlap circuit 100 may input the third control signal CS3 transitioning to the low level to the second bootstrap circuit 310. The second precharge circuit 311 may again increase the voltage of the second node n2 to the initial voltage.

In operation S130, the switch device 1000 may output the voltage of the first node n1. For example, the first power transfer circuit 220 may output the voltage of the first node n1.

For example, the non-overlap circuit 100 may input the second control signal CS2 transitioning to the low level to the first power transfer circuit 220. The first power transfer circuit 220 may output the voltage of the first node n1 to the first switch circuit 230 in response to the second control signal CS2.

For example, the non-overlap circuit 100 may input the first control signal CS1 transitioning to the high level to the first bootstrap circuit 210. The voltage of the first node n1 may be increased by the first capacitor C1.

In operation S120 and operation S130, points in time of the first control signal CS1 to the fourth control signal CS4 which the switch device 1000 outputs may be different from each other. For example, points in time of the first control signal CS1 to the fourth control signal CS4 which the non-overlap circuit 100 outputs may be different from each other. For example, the non-overlap circuit 100 may allow the voltage levels of the first to fourth control signals CS1 to CS4 to transition in order of the fourth control signal CS4, the third control signal CS3, the second control signal CS2, and the first control signal CS1.

In operation S140, the switch device 1000 may increase the voltage value of the first node n1. For example, the first bootstrap circuit 210 may increase the voltage value of the first node n1. As described above, the first bootstrap circuit 210 may control the upper limit of the voltage value of the first node n1.

In operation S150, the switch device 1000 may output the first signal S1. For example, the first switch circuit 230 may output the first signal S1.

For example, as described with reference to FIG. 6, the first switch circuit 230 may be provided with the voltage of the first node n1, which is a voltage greater than the voltage of the enable signal EN, and thus, the first switch circuit 230 may have a relatively small on-resistance.

Figure 12:
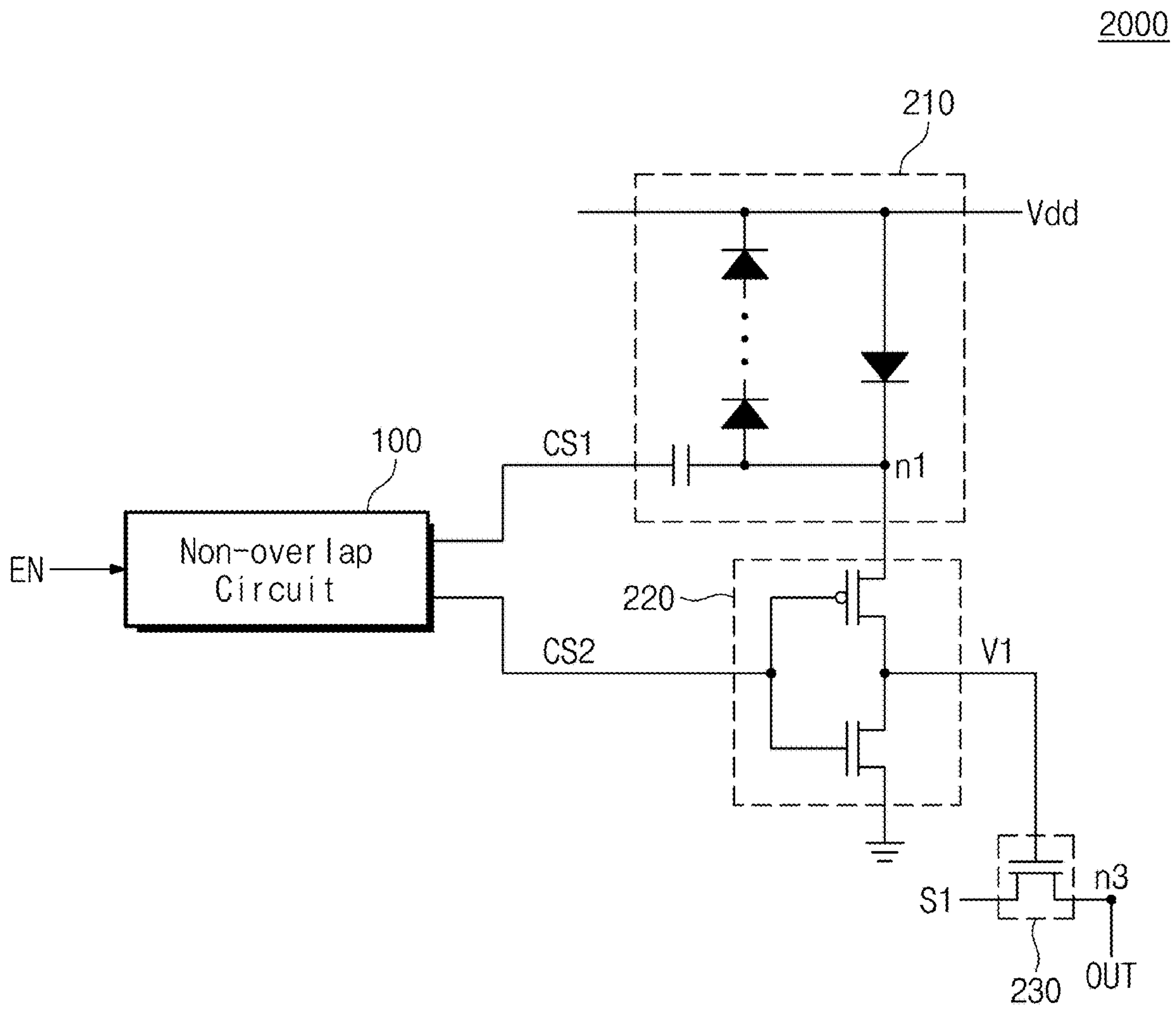
FIG. 12 is a diagram illustrating a configuration of a switch device, according to an embodiment of the present disclosure.

FIG. 12 is a diagram illustrating a configuration of a switch device 2000, according to an embodiment of the present disclosure. For brevity of description, additional description associated with the components described above will be omitted to avoid redundancy.

Referring to FIG. 12, the switch device 2000 may include the non-overlap circuit 100, the first bootstrap circuit 210, the first power transfer circuit 220, and the first switch circuit 230. Unlike FIG. 6, the switch device 2000 may not include the second bootstrap circuit 310, the second power transfer circuit 320, and the second switch circuit 330.

As described with reference to FIG. 6, based on the enable signal EN, the non-overlap circuit 100 may be configured to output the first control signal CS1 and the second control signal CS2 whose voltage level transition time points are different from each other. Before the first control signal CS1 transitioning to the high level is input, the first bootstrap circuit 210 may store the voltage provided from the power device and may set the initial voltage of the first node n1. However, even after the first control signal CS1 is input, the first bootstrap circuit 210 may receive the voltage from the power device. The second control signal CS2 transitioning to the low level may be input, and the first power transfer circuit 220 may output the voltage of the first node n1 to the first switch circuit 230 in response to the second control signal CS2. The first control signal CS1 transitioning to the high level may be input, and the voltage of the first node n1 may increase. The first bootstrap circuit 210 may control the upper limit of the increased voltage of the first node n1. The first switch circuit 230 may be provided with the voltage of the first node n1, which is a voltage greater than the voltage of the enable signal EN, and thus, the first switch circuit 230 may have a relatively small on-resistance.

Figure 13:
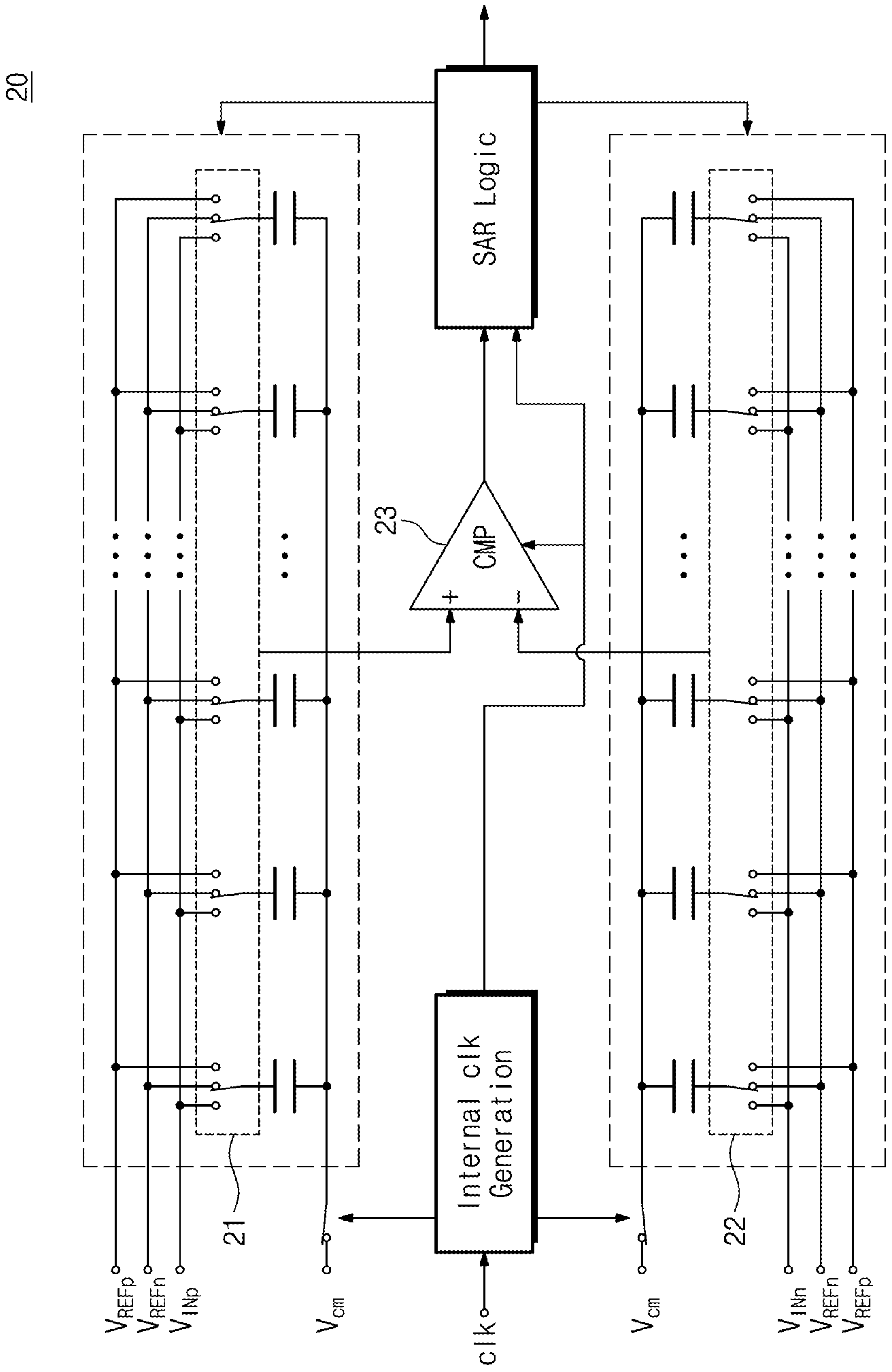
FIG. 13 is a diagram illustrating the case where a switch device is used as an element of a successive approximation register analog to digital converter (SAR-ADC), according to an embodiment of the present disclosure.

FIG. 13 is a diagram illustrating the case where the switch device 1000 is used as an element of a successive approximation register analog to digital converter (SAR-ADC) 20, according to an embodiment of the present disclosure.

The SAR-ADC 20 of FIG. 13 may include a plurality of capacitors and switches 21 and 22. For example, the switches 21 and 22 may be individually controlled by a switch control signal $V_{cm}$, such that each of the plurality of capacitors may be selectively connected to a first signal $V_{REFn}$, a second signal $V_{REFp}$, or a third signal $V_{INp}$. For example, depending on the clock signal clk, the internal clock generation circuit may control the timing of the connection of the switches 21 and 22.

In FIG. 13, switches 21 and 22 may input a first signal $V_{REFn}$ or a second signal $V_{REFp}$ to a comparator 23. For example, the comparator 23 may sequentially output digital values by comparing a voltage corresponding to a charge accumulated by the plurality of capacitors to a reference voltage. For example, the SAR logic circuit may perform a successive approximation operation based on the digital values received from the comparator 23 to output a multi-bit digital signal. For example, the number of output data bits of the SAR-ADC 20 may vary depending on the number of the plurality of capacitors.

Each of the switches 21 and 22 may include the switch device 1000. As the switch device 1000 according to the present disclosure is used, an on-resistance of each of the switches 21 and 22 may decrease without the dummy timing. Also, the switching current may be prevented by inputting the first signal $V_{REFn}$ and the second signal $V_{REFp}$ to the comparator 23 so as not to overlap each other. For example, internal transistors may be prevented from being broken down by controlling the upper limit of the voltage depending on the number of diodes D2 to Dn of FIG. 6.

A switch device according to an embodiment of the present disclosure prevents a switching current by providing input signals to a switching element and a bootstrap element so as not to overlap each other, and provides a voltage to be provided to a switch without a dummy timing occurring in a conventional pumping circuit by in advance storing a voltage from a power device by using a bootstrap circuit. Also, a breakdown phenomenon of an internal transistor element may be prevented by controlling an upper limit of the voltage input to the switch. The switch device according to embodiments of the present disclosure may decrease a switch on-resistance by using highly-integrated and simple circuit components without conventional complicated circuit components for decreasing the switch on-resistance.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A switch device comprising:

a non-overlap circuit configured to output a first control signal to a fourth control signal, voltage levels of which transition at different time points, based on an enable signal;

a first bootstrap circuit configured to increase a voltage of a first node, based on the first control signal;

a first power transfer circuit configured to receive the voltage of the first node and to output a first voltage, based on the second control signal;

a first switch circuit configured to, in response to the first voltage, output a first signal received at an input of the first switch circuit to a third node;

a second bootstrap circuit configured to increase a voltage of a second node, based on the third control signal, wherein the voltage level of the third control signal and the voltage level of the first control signal transition at different time points;

a second power transfer circuit configured to receive the voltage of the second node and to output a second voltage, based on the fourth control signal; and a second switch circuit configured to, in response to the second voltage, output a second signal received at an input of the second switch circuit to the third node.

2. The switch device of claim 1, wherein the non-overlap circuit is configured to:

control the voltage level of the second control signal to transition before the voltage level of the first control signal transitions;

control the voltage level of the fourth control signal to transition before the voltage level of the third control signal transitions;

control the voltage level of the first control signal and the voltage level of the fourth control signal to transition identically;

control the voltage level of the second control signal and the voltage level of the third control signal to transition identically; and control the voltage level of the first control signal and the voltage level of the second control signal to transition differently from each other.

3. The switch device of claim 1, wherein the non-overlap circuit includes a plurality of inverters.

4. The switch device of claim 1, wherein the first bootstrap circuit includes:

a first precharge circuit configured to increase the voltage of the first node, based on the first control signal; and a first breakdown voltage control circuit configured to control an upper limit of a voltage value of the first node.

5. The switch device of claim 4, wherein the first precharge circuit is configured to:

store a voltage input from a power device; and increase the voltage of the first node through the stored voltage as the first control signal is applied to the first precharge circuit.

6. The switch device of claim 5, wherein the first precharge circuit includes:

a first diode connected between the power device and the first node; and a first capacitor connected between a node to which the first control signal is applied and the first node.

7. The switch device of claim 4, wherein the first breakdown voltage control circuit includes a plurality of diodes, and wherein, when the voltage value of the first node exceeds a threshold value, the first breakdown voltage control circuit is configured to decrease the voltage value of the first node to the threshold value.

8. The switch device of claim 7, wherein, as the number of the plurality of diodes increases, the threshold value increases.

9. The switch device of claim 4, wherein the first precharge circuit includes a diode-connected transistor, and wherein the first breakdown voltage control circuit includes a plurality of diode-connected transistors.

10. The switch device of claim 1, wherein the first power transfer circuit includes:

a first PMOS transistor including a first end connected to the first node; and a first NMOS transistor including a first end connected to a second end of the first PMOS transistor and a second end connected to a ground electrode.

11. The switch device of claim 1, wherein the first switch circuit includes a second NMOS transistor.

12. A switch control method of a switch control device which includes a first bootstrap circuit, a second bootstrap circuit, a first power transfer circuit, a second power transfer circuit, a first switch circuit, and a second switch circuit, the method comprising:

setting, by the first bootstrap circuit, an initial voltage of a first node and setting, by the second bootstrap circuit, an initial voltage of a second node;

blocking, by the second power transfer circuit, an output of a voltage of the second node;

outputting, by the first power transfer circuit, a voltage of the first node;

increasing, by the first bootstrap circuit, a voltage value of the first node; and outputting, in response to the voltage of the first node and by the first switch circuit, a first signal applied to an input of the first switch circuit, wherein the switch control device further includes a non-overlap circuit and the method further comprises:

outputting, by the non-overlap circuit, a first control signal to a fourth control signal, voltage levels of which transition at different time points, based on an enable signal, wherein the first control signal controls the first bootstrap circuit, wherein the second control signal controls the first power transfer circuit, wherein the third control signal controls the second bootstrap circuit, wherein the fourth control signal controls the second power transfer circuit, and wherein the voltage level of the third control signal and the voltage level of the first control signal transition at different time points.

13. The method of claim 12, further comprising:

controlling, by the non-overlap circuit, the voltage level of the second control signal to transition before the voltage level of the first control signal transitions;

controlling, by the non-overlap circuit, the voltage level of the fourth control signal to transition before the voltage level of the third control signal transitions;

controlling, by the non-overlap circuit, the voltage level of the first control signal and the voltage level of the fourth control signal to transition identically;

controlling, by the non-overlap circuit, the voltage level of the second control signal and the voltage level of the third control signal to transition identically; and controlling, by the non-overlap circuit, the voltage level of the first control signal and the voltage level of the second control signal to transition differently from each other.

14. The method of claim 12, further comprising: based on the first control signal, increasing, by the first bootstrap circuit, the voltage of the first node; and controlling, by the first bootstrap circuit, an upper limit of a voltage value of the first node.

15. The method of claim 14, further comprising:

storing, by the first bootstrap circuit, a voltage input from a power device; and increasing, by the first bootstrap circuit, the voltage of the first node through the stored voltage as the first control signal is input.

16. The method of claim 15, wherein the first bootstrap circuit includes:

a first diode connected between the power device and the first node; and a first capacitor connected between a node to which the first control signal is input and the first node.

17. The method of claim 14, wherein the first bootstrap circuit includes a plurality of diodes and the method further comprises:

controlling, by the plurality of diodes, the upper limit of the voltage value of the first node.

18. The method of claim 17, wherein, as the number of the plurality of diodes increases, the upper limit of the voltage value of the first node increases.

19. A switch control device comprising:

a non-overlap circuit configured to output a first control signal and a second control signal, voltage levels of which transition at different time points, based on an enable signal;

a first bootstrap circuit including a precharge circuit configured to increase a voltage of a first node, based on the first control signal, and a breakdown voltage control circuit configured to control an upper limit of a voltage value of the first node;

a first power transfer circuit configured to receive the voltage of the first node and to output a first voltage, based on the second control signal; and a first switch circuit configured to, in response to the first voltage, output a first signal received at an input of the first switch circuit to a third node.

20. The switch control device of claim 19, wherein the non-overlap circuit is further configured to output a third control signal and a fourth control signal, wherein the switch control device further comprises:

a second bootstrap circuit configured to increase a voltage of a second node, based on the third control signal, a second power transfer circuit configured to receive the voltage of the second node and to output a second voltage, based on the fourth control signal; and a second switch circuit configured to, in response to the second voltage, output a second signal received at an input of the second switch circuit to the third node, and wherein the voltage level of the third control signal and the voltage level of the first control signal transition at different time points.

* * * * *